(12) United States Patent
Grinwald et al.

(10) Patent No.: US 7,476,603 B2
(45) Date of Patent: Jan. 13, 2009

(54) PRINTING CONDUCTIVE PATTERNS USING LEP

(75) Inventors: Yaron Grinwald, Gedera (IL); Tomer Spector, Neve Monoson (IL); Boaz Galil, Rehovot (IL); Eyal Bachar, Jerusalem (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 375 days.

(21) Appl. No.: 11/147,956

(22) Filed: Jun. 7, 2005

(65) Prior Publication Data

US 2006/0273305 A1    Dec. 7, 2006

(51) Int. Cl.
  *H01L 21/20* (2006.01)
  *H01L 51/40* (2006.01)
  *H01L 51/44* (2006.01)
  *H01L 35/24* (2006.01)

(52) U.S. Cl. .................. 438/584; 438/99; 438/658; 257/40; 257/750

(58) Field of Classification Search .................. 438/82, 438/99, 584; 257/40, 750
See application file for complete search history.

(56) References Cited

U.S. PATENT DOCUMENTS

| | | | |
|---|---|---|---|
| 4,504,138 A | 3/1985 | Kuehnle et al. | |
| 4,690,539 A | 9/1987 | Radulski et al. | |
| 5,749,032 A | 5/1998 | Landa et al. | |
| 6,503,831 B2 | 1/2003 | Speakman | |
| 6,713,389 B2 | 3/2004 | Speakman | |
| 6,890,584 B2 | 5/2005 | Leenders et al. | |
| 2001/0011867 A1* | 8/2001 | Nagayama et al. | 313/500 |
| 2002/0110391 A1* | 8/2002 | Watanabe | 399/237 |
| 2002/0119584 A1* | 8/2002 | Duthaler et al. | 438/21 |
| 2004/0129542 A1* | 7/2004 | Kawaguchi et al. | 200/61.1 |
| 2004/0209191 A1 | 10/2004 | Bernds et al. | |
| 2006/0127673 A1* | 6/2006 | Aho et al. | 428/411.1 |

FOREIGN PATENT DOCUMENTS

| | | |
|---|---|---|
| WO | WO03/059027 | 7/2003 |
| WO | WO 03059027 A1 * | 7/2003 |
| WO | WO03059027 A1 * | 7/2003 |
| WO | WO2004/011250 | 2/2004 |
| WO | WO2004/094501 | 11/2004 |

OTHER PUBLICATIONS

Transmittal of the International Search Report and the Written Opinion of the International Searching Authority dated Dec. 7, 2006.
Trchova, Miroslava et al., Spectroscopy of conjugated polymers polyaniline, Electronic Properties of Molecular Materials and Functional Polymers, 2001-S, pp. 151-156.

* cited by examiner

*Primary Examiner*—Shouxiang Hu

(57) ABSTRACT

A method of printing an electrode component is disclosed. The method can include steps of electrostatically printing a polymer onto a substrate, where at least a portion of the printing occurs while the polymer is in a first conductive state, and altering the polymer to a second conductive state that is more conductive than the first conductive state, thereby forming the electronic component.

19 Claims, 1 Drawing Sheet

PRINTING CONDUCTIVE PATTERNS USING LEP

FIELD OF THE INVENTION

The present invention relates generally to the printing of electronic components. More particularly, the present invention relates to using liquid electro printing (LEP) to create electronic components.

BACKGROUND OF THE INVENTION

Electronics have become increasingly important in the everyday lives of many people in all aspects of society, including business, school, and home environments. As the need and desire for electronics increases, methods for low cost design and manufacturing of the electronic circuits that make up these devices become increasingly important.

Numerous conventional techniques exist to construct electronic circuitry. Such processes can include photolithography, chemical vapor deposition, etching, masking, oxidation, dopant diffusion, etc. These processes are often expensive and slow. In addition, processes such as dopant diffusion and etching are difficult to accurately control, and thus can lead to a loss in accuracy of the shape of the electronic device or integrated circuit being created. These inaccuracies often lead to reduced performance of the fabricated device.

Because of the increased need for electronics, methods and devices are continually being sought to increase the speed and accuracy of fabrication techniques.

DETAILED DESCRIPTION OF THE PREFERRED EMBODIMENT(S)

Figure 1:
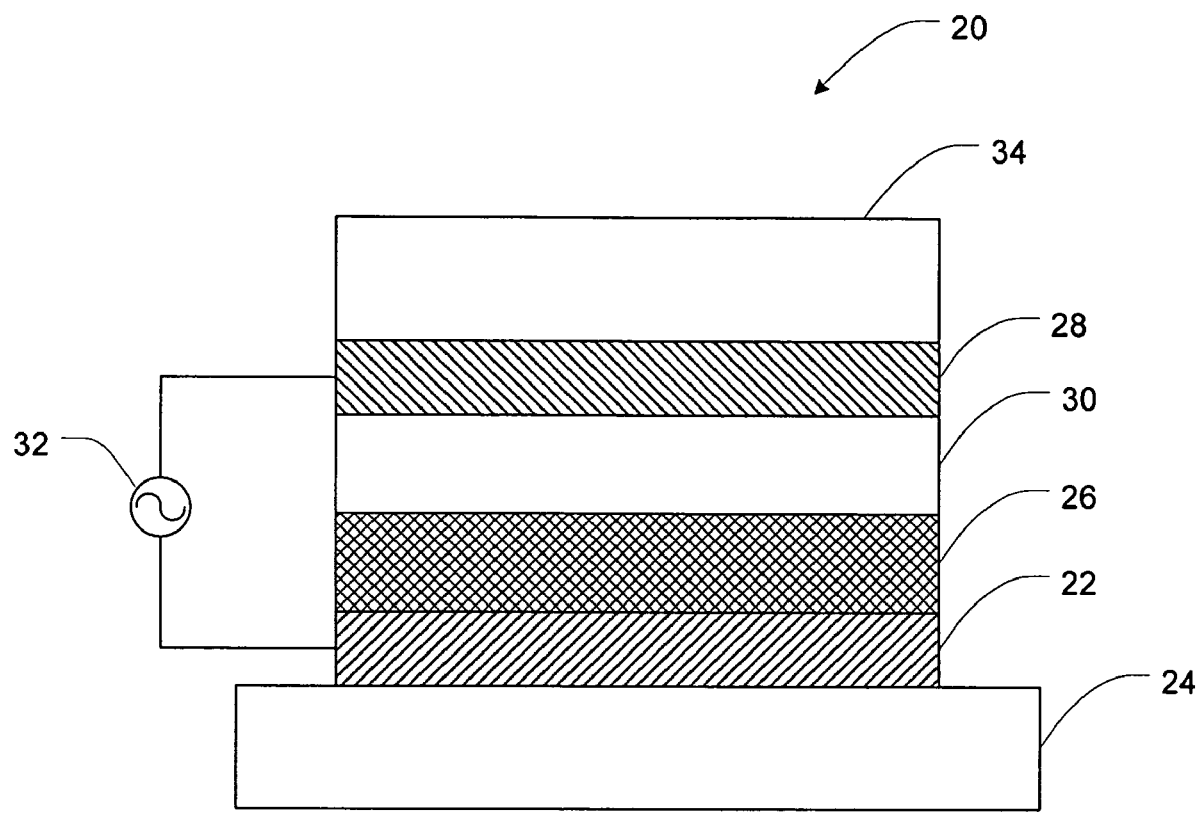
FIG. 1 is a cross-sectional view of a luminescent device in accordance with an embodiment of the present invention.

Reference will now be made to the exemplary embodiments of the present invention, both those described and those illustrated in the drawing, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In describing and claiming the present invention, the following terminology will be used.

The singular forms "a," "an," and "the" include plural referents unless the context clearly dictates otherwise. Thus, for example, reference to "a dye" includes reference to one or more of such materials.

The term "electronic component" can refer to any structure configured to conduct electrical current, such as electronic circuits, integrated circuits, conductive traces, conductive interconnects, transistors, diodes, resistors, capacitors, active or passive based semiconductors with conductive electrodes such as thin film transistors (TFT), antenna and interconnects for RF devices such as RFID, electromagnetic interference (EMI) as a conductive coating with shielding, conductive coatings for packages of electronic device, etc.

As used herein, the term "conductive state" and "electrically conductive state" can be used interchangeable, and refer to the level of conductivity of a material. The level of conductivity can be altered for specific types of materials, particularly certain organic polymers, which can be modified from a first conductive state to a second conductive state.

The terms "alter," "alteration," etc. can be used interchangeably, and refer to processes for changing the conductive state of a conductive polymer or other material. The alteration or doping can be by chemical or electrochemical action. Sometimes, the alteration of a conductive polymer from a first conductive state to a second conductive state can be referred to as "doping."

The term "liquid electro printing" (LEP) refers to a process of printing a liquid toner is printed through an electric field onto a surface to form an electrostatic pattern. In most LEP processes, this pattern is then transferred to at least one intermediate surface, and then to a substrate. The term "liquid electro printer" refers to a printer capable of LEP.

The term "electrostatically printing" refers to a process of printing whereby a colorant or other material is arranged into a pattern or a layer by an electric field. This can occur by passing the colorant or other material through an electric field onto an electrostatic surface. One example of electrostatic printing is the LEP process.

The term "about" when referring to a numerical value or range is intended to encompass the values resulting from experimental error that can occur when taking measurements.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

In accordance with the present invention, one aspect provides a method of printing an electronic component. The method can include steps of electrostatically printing a polymer onto a substrate, where at least a portion of the printing occurs while the polymer is in a first conductive state, and altering the polymer to a second conductive state that is more conductive than the first conductive state, thereby forming the electronic component.

In another aspect, a system for printing an electronic component is provided. The system can include a liquid electro-printer, and a polymer loaded in the liquid electro-printer, the polymer being dispersed or dissolved in a liquid and having a first conductive state and a more conductive second conductive state. Furthermore, the liquid electro-printer can be configured to print the polymer in the first conductive state through an electric field.

In one example of a specific aspect, a luminescent device can be prepared in accordance with embodiments of the present invention. The luminescent device can have a first electrode layer including a polymer where the polymer can have a first conductive state and a more conductive second conductive state. The polymer is, however, configured in the second conductive state. The luminescent device can also include a phosphor layer disposed on at least a portion of the first electrode layer, and a second electrode layer disposed on at least a portion of the phosphor layer. Additionally, a current source is electrically coupled to the first electrode layer and to the second electrode layer, which is configured to illuminate the phosphor layer.

In yet another aspect, an electronic component is provided that is prepared by the process of electrostatically printing a polymer onto a substrate where at least a portion of the printing occurs while the polymer is in a first conductive state, and altering the polymer to a second conductive state that is more conductive than the first conductive state, thereby forming the electronic component.

It has been discovered that methods of using conjugated polymers as pigments to create conductive patterns for electronic components is possible. In one embodiment, LEP can be utilized to deposit the polymer. One major hurdle in using LEP relates to interactions between the LEP machine and the polymer. LEP is based on the electrophoretic transportation of heavy charged particles under a high electric field to an intermediate surface, such as a digital plate or drum. Many LEP processes subsequently transfer the charged particles to a second intermediate surface, such as an intermediate transfer medium (ITM). This second transfer occurs via an opposite electric field. The charged particles can then be transferred to a substrate. Using a conductive material, however, may destroy the laminar electric field, and thus interfere with the electrophoretic deposition of the polymer onto the digital plate, or subsequently to the ITM. Deposited conductive material can also cause shorts between the digital plate and the ITM, thus resulting in an uncontrolled transfer and a disrupted conductive pattern. LEP printing is further described in U.S. Pat. No. 5,749,032, which is incorporated herein by reference.

This problem has been solved in accordance with the present invention by printing certain organic polymers having at least two conductive states. For example, polymers having a state of relatively high electrical resistance can reliably be printed into electrostatic patterns using a LEP machine. Such polymers can be electrostatically printed directly onto a substrate, or they can be transferred to the substrate via one or more intermediate surfaces. In one aspect, the one or more intermediate surface can include a digital plate and/or a transfer medium such as an ITM. Because the polymers are printed in a relatively high resistance state, the laminar electric fields used to transfer the electrostatic patterns from one surface to another or from one surface to the substrate are not disturbed or interrupted to an extent which interferes with printing. In one embodiment, following transfer through the laminar electric field, the polymer can be altered to become more conductive, thus creating a conductive pattern.

As mentioned, certain organic polymers represent one group of materials that undergo such a transformation. These organic polymers often have a conjugated π electronic system in their backbones, and are capable of existing in at least two electrically conductive states. The first of these is a state where the polymer has a relatively high electrical resistance, in some cases similar to that of semiconductors. Polymers with various levels of electrical resistance in their first states are considered to be within the scope of the present invention, so long as they are capable of being printed through an electric field with minimal disruption. In one aspect, the polymer is substantially nonconductive. In the second more electrically conductive state, the polymer can be said to be in an altered state, and thus have a relatively high conductivity. The alteration from one state to the other can occur by, inter alia, chemical or electrochemical oxidation, as discussed herein. It should be noted that the reverse reaction can occur, altering a conductive polymer to a resistive polymer.

The polymer can be in various physical configurations that can be useful in the various aspects of the present invention. In one aspect, the polymer can be dispersed or dissolved in a liquid. Suitable liquid carriers can be any known to one skilled in the art. In one aspect, the liquid can be a resin carrier. As such, the alteration of the polymer to the second electrically conductive state can occur prior to or following drying of the polymer on the substrate. In addition to altering the polymer after it is electrostatically printed on the substrate, it is also contemplated that the alteration of the polymer to the second conductive state can occur prior to applying the polymer to the substrate, as long as the heightened conductive nature of the polymer does not interfere with the LEP function. This can be accomplished by any means known to one skilled in the art, including, without limitation, altering the polymer while it is located on an intermediate or other surface prior to being transferred to the substrate, or it can be altered while in flight but following its passage thorough the laminar electric field.

Numerous organic inherently conductive polymers can be used to print electronic components. Useful polymers are those that can exist in a first conductive state and a second conductive state as explained herein, and that have a first conductive state that is capable of undergoing deposition by the LEP process. Any polymer known to one skilled in the art that meets these criteria would be considered to be within the scope of the present invention. Examples include, without limitation, polyanilines, polythiopenes, polyacetylenes, polypyrroles, polyparaphenylenes, polyparaphenylene vinylenes, 2 methyl-ethyl-hexyloxy-p-phenylene vinylene, polyethylenedioxythiopene, and combinations thereof. In one aspect, the polymer is polyaniline. In another aspect, the polyaniline is emeraldine base.

Polyaniline has several substantially nonconductive oxidation states. Any of these substantially nonconductive states can be utilized as the first conductive state of polyaniline. One of the most stable of these configurations is emeraldine base (EB) or poly-paraphelylene-amine-imine, as shown in Formula (1).

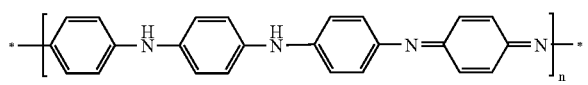

Formula (1)

This generalized A-B polymer is half oxidized, containing in its unit cell a quinoid and three aromatic rings. Alteration or doping of the EB polymer by, for example, reacting it with an acid can generate a second conductive state polyaniline, namely emeraldine salts (ES), as shown in Formula (2).

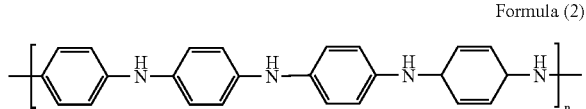

Formula (2)

In the above formulas, n can be from 1 to 10,000, for example. It is known that EB, ES, and leucoermaldine (LE) have different charge distributions that can affect the conductivity of each species. Such charge distributions can vary as is known to those skilled in the art, and thus have been excluded from Formulas 1 and 2, but are, however, included in the scope of the present invention.

Without being bound by any theory related to the functional nature of the conductive polymer, it is believed that the conductivity of the polymer is due to the presence of cation radicals in the polymeric structure. The charge is thought to be localized over several repeating units. Since the localized charges can move along the polymeric chain, they are thought to be charge carriers, thus resulting in a conductive polymer.

As has been described herein, the alteration or doping of the organic inherently conductive polymer from the first conductive state to the second conductive state can be accomplished by any means known to one skilled in the art, including oxidation. As such, a developer can convert the polymer to a conductive state that has a higher conductance than what can be effectively printed through the electric field of the liquid electro printer. One convenient means of oxidation can include contacting or treating the polymer with a developer such as an acid. Numerous acids are known that are capable of doping the polymer, and all are considered to be within the scope of the present invention. For example, and without limitation, the acid can include, without limitation, organic acids such as acetic acid, formic acid, benzoic acid, salicylic acid, oxalic acid, trifluoromethanesulfonic acid, and combinations and derivatives thereof, or inorganic acids such as sulfuric acid, hydrochloric acid, nitric acid, phosphoric acid, tungsten acid, and combinations and derivates thereof. Also, doping can be accomplished by electrochemical means, such as electrochemical oxidation. Further discussion of developing electrostatic latent images formed on a photoconductor surface can be found in U.S. Pat. No. 4,504,138, which is incorporated herein by reference. Various imaging methodologies contained therein can be utilized to produce very well defined features in the electronic component.

The polymer can be electrostatically printed in combination with a conductive additive that is more conductive than the first conductive state of the polymer, provided the conductive additive is suitable for LEP. In this manner, the conductivity of the dried conductive polymer can be increased to a level that is greater than the conductivity of the second conductive state. Care should be taken, however, that the conductive additive does not interfere with the electric field of the LEP process. As such, the conductive additive can include, without limitation, carbon black, nickel, silver, and combinations thereof. In one aspect of the present invention, the conductive additive can be carbon black.

As an example, before acid treatment, different formulations where the total percentage of non volatile solid (NVS) carbon black ranges from about 10 wt % to about 25 wt % are prepared. To these formulations, two probe resistances are measured which are varied from about 100 MΩ to less than 0.1 MΩ with a resistance break point at about 15 wt % carbon black. This resistance breakpoint defines the percolation threshold of the carbon in the film. In this example, the total percentage of NVS carbon black below the percolation threshold presents a situation where carbon particles exhibit relatively little interaction with one another. However, when the total NVS carbon black is above the percolation threshold, a situation where carbon particles interact and contact one another becomes more frequently. This can be demonstrated by a lower resistance to electrical current. However, in each formulation, after acid treatment, all of films provide two probe resistances of 1 kΩ, indicating greater conductivity across the board. Thus, in this example, no charge binder is needed to achieve high particle conductivity. This being stated, it should be noted that the compositions including a conductive polymer as a pigment may achieve a particle conductivity of 300 pMoh without the addition of a viscosity controlling agent or aluminum di/tri butoxide. Thus, the pigment may serve as charge binder for the NVS.

The conductive polymer can be included in a liquid vehicle to facilitate electrostatic printing. Liquid vehicles can include various additives such as water, cosolvents, surfactants, buffering agents, biocides, sequestering agents, viscosity modifiers, humectants, binders, plasticizers, and/or other known additives.

Regarding the substrate that can be used in accordance with embodiments of the present invention, any suitable substrate that can be configured to receive a polymer from the liquid electro-printer can be used. Examples of suitable substrates can include, without limitation, paper, photo paper, transparency, velum, plastics, fiberglass, ceramics, silicon wafers, metallic foils such as aluminum, transparent conductive layers such as ITO or ATO, and combinations thereof. The substrate can be integral to the electronic component, or it can be a temporary support from which the electronic component can be removed following printing and drying.

In one specific embodiment of the present invention, a luminescent device 20 can be formed in accordance with embodiments of the present invention. In one embodiment, this device can be a high-field thin-film electroluminescent (HFTFEL) light emitting structure. The luminescent device can have a first electrode layer 22 including a polymer where the polymer can have a first conductive state and a more conductive second conductive state. When in the device, however, the polymer is configured in the second conductive state. The first electrode layer can include the polymer printed as a conductive pattern by the LEP process. In one aspect, the first electrode is a multilayer electrode including a substrate 24 having the polymer printed thereon. The substrate can be integral to the luminescent device, or it can be removed prior to use.

The luminescent device 20 can also include a phosphor layer 26 disposed on at least a portion of the first electrode layer 22, and a second electrode layer 28 disposed on at least a portion of the phosphor layer. Phosphor materials suitable for use in constructing the phosphor layer are well known in the art, and as such any material that emits measurable light in the presence of an electrical current can be utilized in the phosphor layer. Additionally, in those embodiments where the first electrode layer includes a polymer printed in a conductive pattern, aspects are also provided where the phosphorous layer can be printed in a substantially matching or partially matching conductive pattern. The spatial alignment of the first electrode layer and the phosphor layer provides the advantage of reducing unwanted light in regions outside of the conductive pattern.

An insulating layer 30 can be disposed between the phosphor layer 26 and the second electrode layer 28. The insulating layer can be a variety of materials with varying low dielectric constants (1-10), such as, but without limitation, inorganic materials such as silicon oxide or fluoro-silicone oxide, polymeric films such as PE, PP, PMMA, and derivatives and combinations thereof. In another embodiment, the insulating layer can be disposed between the first electrode layer 22 and the phosphor layer. In yet another embodiment, a first insulating layer can be disposed between the first electrode and the phosphor layer, and a second insulating layer can be disposed between the phosphor layer and the second electrode layer. An outer insulating layer 34 can also be included as a cover to the second electrode layer. This outer insulating layer can protect and contain the second electrode layer.

Additionally, a current source 32 can be electrically coupled to the first electrode layer 22 and to the second electrode layer 28, which is configured to illuminate the phosphor layer 26. Current sources are well known to those skilled in the art, and can vary depending on the configuration of the luminescent device. In one aspect, the current source can be an alternating current source, particularly for those embodiments including insulating layers.

As one purpose of the luminescent device is to emit light, it can be beneficial to utilize specific materials that allow light transmission. As such, in one aspect, either of the first electrode layer 22 or the second electrode layer 28 can be substantially transparent or semitransparent. In another aspect, both the first and second electrode layers can be substantially transparent or semitransparent. Transparent materials are well known in the art, and can include indium tin oxide materials and the like disposed on glass, plastics, etc. In various aspects, depending on particular device configurations, it may be beneficial to construct the insulating layer from a substantially transparent or semitransparent material to further allow the transmission of light.

Numerous uses of the luminescent device are contemplated, including active or passive matrixes for information displays or information readers, light emitting components, liquid crystal switches, thin film transistor (TFT) devices, etc. It is intended that any component or device that would benefit from such a thin-film luminescent device be included in the scope of the present invention. Details describing electrophoretic displays and active matrix liquid crystal displays can be found in U.S. Pat. Nos. 6,300,932 and 6,274,412, respectively.

The present invention also provides aspects directed toward electronic components prepared by the processes described herein. As has been discussed above, the electronic component can be formed by electrostatically printing a polymer onto a substrate where at least a portion of the printing occurs while the polymer is in a first conductive state, and altering the polymer to a second conductive state that is more conductive than the first conductive state. In one aspect, the electronic component can be formed layer by layer using an intermediate surface as described in U.S. Pat. No. 4,690,539. As such, the multicolor technique recited therein can be utilized to deposit layers of polymer on a substrate to create conductive patterns for electrical circuits and conductive electrodes such as active matrix TFT. Further detail of multicoloring imaging systems that can be utilized to create the electronic components of the present invention are described in U.S. Pat. Nos. 3,900,003; 4,400,079; 4,342,823; 4,073,266; and 3,405,683.

EXAMPLES

The following examples illustrate the embodiments of the invention that are presently best known. However, it is to be understood that the following are only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following Examples provide further detail in connection with what are presently deemed to be the most practical and preferred embodiments of the invention.

Example 1

Emeraldine base based ElectroInk is made as follows: 30-50 wt % by solids of emeraldine base is mixed with resin F varnish. Resin F varnish is a copolymer of polyacrylic acid and polyethylene. The two components are ground in S-0 atritor (made by Union process, Akron, Ohio USA) for about 4 hours in 19 wt % non volatile solid (NVS). The resulting slurry is diluted to 2 wt %. A solution of 5 wt % aluminum di/tri butoxide (ALB) is added to give 0.5 wt % of ALB by solids. The diluted slurry mixture is mixed for approximately 5 minutes. A 0.3 wt % amount of NCD (charge director) is added to give 50-70 pMoh (Moh=1/Ohm) low field conductivity. The particle conductivity of the resulting emeraldine base ink can be measured to be in the range of 150-200 pMoh.

Example 2

A conductive pattern can be created as follows: The 2 wt % emeraldine base ink is printed in a pattern on a paper substrate using an LEP process. In this case an Ultra-Stream LEP printer can be used. The pattern is allowed to dry in air and later heat fused on a hot plate to give an insulating pattern. The insulating pattern is covered with a 10 wt % solution of sulfuric acid for 5 minutes. The product of the emeraldine base and the sulfuric acid results in an emeraldine salt. The acid solution is wiped off the substrate. The print resolution is about 100 μm. The conductivity of the pattern can be measured to be about 15 kΩ by two probe measurement.

Example 3

A conductive additive can be included as follows: A carrier resin (varnish) of 40 wt % NVS is ground with the combination of carbon black (Vulcan XC72) and the formulation of emeraldine base from Example 1 to total 60 wt % NVS. The resultant formulation is printed with a LEP process onto paper to give films with different conductivities based on the amount of carbon black in the formulation. The conductivity of the conductive pattern increases as the % carbon black in the formulation is increased.

Example 4

A luminescent device can be constructed as follows: A pattern is printed on a paper substrate with an Ultra-Stream printer. The print resolution is about 100 μm. After converting the pattern to a conductive pattern as described in Example 2, the conductivity can be measured to be about 15 kΩ by two probe measurement. A phosphor layer is made by casting a phosphor mix onto transfer paper. The phosphor mix includes 50 wt % solid phosphor powder and resin as a varnish with a total solids content of 28 wt % (% NVS). The phosphor mix is cast onto transfer paper (Peliken) using a casting blade with full area coverage. The resulting cast layer is allowed to air dry for 5-10 min, following which it is fused on a hot plate at 90° C.

The phosphor layer is ironed onto the conductive pattern at 160° C. with the transfer paper facing down. Prior to ironing, an aluminum strip is inserted between the phosphor layer and the conductive pattern. The aluminum strip is left hanging out from between the layers to allow for electrical contact. Following ironing, the transfer paper is peeled off leaving the phosphor layer and the insulating layer as the transfer media.

A Baytron® solution is drop cast onto transfer paper and let dry in air. The Baytron® film is ironed onto the insulating layer at 160° C. with the transfer paper facing down. Prior to ironing, an aluminum strip is inserted between the insulating layer and the semitransparent, conductive Baytron® film. The aluminum strip is left hanging out for electrical contact. The transfer paper is peeled off leaving the Baytron® layer and the top insulating layer.

Example 5

A luminescent device is constructed as in Example 4, with the exception that the Baytron® film is cast directly onto the insulating layer.

Example 6

A luminescent device is constructed as in Example 4, with the exception that the Baytron® film can be an indium tin oxide (ITO) layer.

Example 7

An AC current source is electrically coupled to the bottom and top aluminum strips of the luminescent device from Example 4. AC current is introduced at about 100 Hz. Green light is emitted from the device at about 200 V. Intensity increases to about 450 V.

While the invention has been described with reference to certain preferred embodiments, those skilled in the art will appreciate that various modifications, changes, omissions, and substitutions can be made without departing from the spirit of the invention. It is therefore intended that the invention be limited only by the scope of the appended claims.

What is claimed is:

1. A method of printing an electronic component, comprising steps of:
   electrostatically printing a polymer onto a substrate, at least a portion of said printing occurring while the polymer is in a first conductive state, said polymer being combined with a conductive additive that is more conductive than said first conductive state of said polymer but does not interfere with an electric field of said electrostatic printing; and
   altering the polymer by chemical or electrochemical oxidation to a second conductive state that is more conductive than the first conductive state, thereby forming the electronic component.

2. The method of claim 1, wherein the step of electrostatically printing includes a step of transferring the polymer to the substrate via one or more intermediate surface.

3. The method of claim 2, wherein the one or more intermediate surface includes a digital plate and a transfer medium.

4. The method of claim 1, wherein the step of altering occurs after electrostatically printing the polymer onto the substrate.

5. The method of claim 1, wherein the polymer is dispersed or dissolved in a liquid when printed onto said substrate.

6. The method of claim 5, further comprising a step of drying the polymer on the substrate prior to the step of altering.

7. The method of claim 1, wherein the first conductive state is substantially nonconductive.

8. The method of claim 1, wherein the conductive additive is a member selected from the group consisting of carbon black, silver, nickel, and combinations thereof.

9. The method of claim 1, wherein the conductive additive is a conductive powder.

10. The method of claim 1, wherein the step of altering the polymer is accomplished by contacting the polymer with an acid.

11. The method of claim 1, wherein the polymer is a member selected from the group consisting of polyanilines, polythiopenes, polyacetylenes, polypyrroles, polyparaphenylenes, polyparaphenylene vinylenes, 2 methyl-ethyl-hexyloxy-p-phenylene vinylene, polyethylenedioxythiopene, and combinations thereof.

12. The method of claim 11, wherein the polymer is emeraldine base.

13. An electronic component prepared by the process of
   electrostatically printing a polymer onto a substrate, said polymer being combined with a conductive additive, and at least a portion of said printing occurring while the polymer is in a first conductive state; and
   altering the polymer by chemical or electrochemical oxidation to a second conductive state that is more conductive than the first conductive state, thereby forming the electronic component;
   wherein said polymer serves as a charge insulator for said conductive additive before said polymer is altered and as a charge binder for said conductive additive once said polymer is altered.

14. The component of claim 13, wherein the step of altering occurs after electrostatically printing the polymer onto the substrate.

15. The component of claim 13, wherein the step of electrostatically printing includes printing the polymer through an electric field while the polymer is in the first conductive state.

16. The component of claim 13, wherein the first conductive state is substantially nonconductive.

17. The component of claim 13, wherein said conductive additive is more conductive than said polymer when said polymer is in the first conductive state of the polymer.

18. The component of claim 13, wherein the polymer is a member selected from the group consisting of polyanilines, polythiopenes, polyacetylenes, polypyrroles, polyparaphenylenes, polyparaphenylene vinylenes, 2 methyl-ethyl-hexyloxy-p-phenylene vinylene, polyethylenedioxythiopene, and combinations thereof.

19. The component of claim 18, wherein the polymer is emeraldine base.

* * * * *